United States Patent
Katsuno et al.

(10) Patent No.: US 9,397,267 B2
(45) Date of Patent: Jul. 19, 2016

(54) SEMICONDUCTOR LIGHT EMITTING ELEMENT WITH CONDUCTIVE LAYER HAVING OUTER EDGE POSITIONED INSIDE OUTER EDGE OF LAMINATED BODY

(71) Applicant: KABUSHIKI KAISHA TOSHIBA, Tokyo (JP)

(72) Inventors: Hiroshi Katsuno, Komatsu Ishikawa (JP); Akira Ishiguro, Kanazawa Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/634,878

(22) Filed: Mar. 1, 2015

(65) Prior Publication Data

US 2016/0072019 A1 Mar. 10, 2016

(30) Foreign Application Priority Data

Sep. 4, 2014 (JP) ................. 2014-180308

(51) Int. Cl.
| | | |
|---|---|---|
| *H01L 33/50* | (2010.01) | |
| *H01L 33/36* | (2010.01) | |
| *H01L 33/40* | (2010.01) | |
| *H01L 33/06* | (2010.01) | |
| *H01L 33/32* | (2010.01) | |
| *H01L 33/38* | (2010.01) | |
| *H01L 33/62* | (2010.01) | |

(52) U.S. Cl.
CPC .............. *H01L 33/405* (2013.01); *H01L 33/06* (2013.01); *H01L 33/32* (2013.01); *H01L 33/382* (2013.01); *H01L 33/62* (2013.01)

(58) Field of Classification Search
CPC ......... H01L 33/60; H01L 33/20; H01L 33/62; H01L 33/54; H01L 33/44; H01L 33/405; H01L 33/06
See application file for complete search history.

(56) References Cited

U.S. PATENT DOCUMENTS

| | | | |
|---|---|---|---|
| 8,450,751 B2 | 5/2013 | Engl et al. | |
| 8,492,785 B2* | 7/2013 | Hodota | H01L 33/405 257/103 |
| 8,847,271 B2* | 9/2014 | Katsuno | H01L 33/62 257/99 |
| 8,890,201 B2* | 11/2014 | Kato | H01L 33/0079 257/678 |
| 2013/0126920 A1 | 5/2013 | Sundgren et al. | |
| 2013/0146910 A1 | 6/2013 | Maute et al. | |
| 2014/0138722 A1* | 5/2014 | Yamada | H01L 33/36 257/98 |
| 2014/0191269 A1* | 7/2014 | Katsuno | H01L 33/62 257/98 |

FOREIGN PATENT DOCUMENTS

JP         2014-003326 A     1/2014

* cited by examiner

*Primary Examiner* — Thomas L Dickey
*Assistant Examiner* — Damon Hillman
(74) *Attorney, Agent, or Firm* — Patterson & Sheridan, LLP

(57) ABSTRACT

A semiconductor light emitting element of an embodiment includes a laminated body having first, second, and third semiconductor layers stacked on each other in a first direction, the third semiconductor layer being between the first and second semiconductor layers in the first direction. The laminated body includes a first region and a second region spaced from the first region a second direction which intersects the first direction. The first electrode is electrically connected to the first semiconductor layer. The second electrode is disposed between the first region and the second region along the second direction. The first conductive layer electrically connects the second semiconductor layer and the second electrode to each other. An outer edge of the first conductive layer is positioned inside an outer edge of the laminated body.

20 Claims, 6 Drawing Sheets

SEMICONDUCTOR LIGHT EMITTING ELEMENT WITH CONDUCTIVE LAYER HAVING OUTER EDGE POSITIONED INSIDE OUTER EDGE OF LAMINATED BODY

CROSS-REFERENCE TO RELATED APPLICATION

This application is based upon and claims the benefit of priority from Japanese Patent Application No. 2014-180308, filed Sep. 4, 2014, the entire contents of which are incorporated herein by reference.

FIELD

Embodiments described herein relate to a semiconductor light emitting element.

BACKGROUND

For a semiconductor light emitting element such as a light emitting diode (LED), there is a demand for enhancement of efficiency and reliability.

DETAILED DESCRIPTION

Figure 1A:
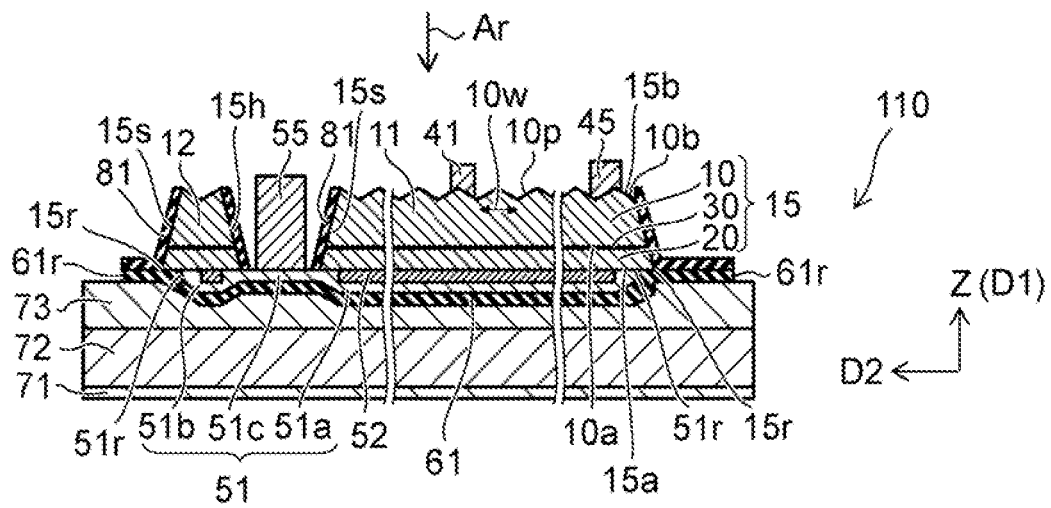
FIG. 1A and FIG. 1B are schematic views depicting a semiconductor light emitting element according to a first embodiment.

According to an example embodiment, there is provided a semiconductor light emitting element having high reliability.

In general, according to one embodiment, a semiconductor light emitting element includes: a laminated body; a first electrode; a second electrode; and a first conductive layer. The laminated body includes: a first semiconductor layer; a second semiconductor layer; and a third semiconductor layer disposed between the first semiconductor layer and the second semiconductor layer. The laminated body includes a first region; and a second region that lines up (aligns) with the first region in a second direction which intersects with a first direction along which the second semiconductor layer and the first semiconductor layer are laminated to each other. The first electrode is electrically connected to the first semiconductor layer. The second electrode is disposed between the first region and the second region. The first conductive layer connects the second semiconductor layer and the second electrode to each other. An outer edge of the first conductive layer is positioned inside an outer edge of the laminated body.

In general, according to another embodiment, a semiconductor light emitting element includes a laminated body, a first electrode, a second electrode, and a first conductive layer. The laminated body includes a first semiconductor layer, a second semiconductor layer, and a third semiconductor layer disposed between the first semiconductor layer and the second semiconductor layer in a first direction. The laminated body includes a first region and a second region spaced from the first region in a second direction which crosses the first direction. The first electrode is electrically connected to the first semiconductor layer. The second electrode is disposed between the first region and the second region in the second direction. The first conductive layer electrical connects the second semiconductor layer to the second electrode. An outer edge of the first conductive layer is positioned inside an outer edge of the laminated body. That is, the first conductive layer extends along the second direction to a first outer edge, and the laminated body extends along the second direction to a second outer edge and the first and second outer edges are disposed such that a straight line extending along the first direction from the first outer edge crosses the laminated body.

Hereinafter, example embodiments of the present disclosure are explained by reference to drawings.

The drawings are schematic or conceptual views and hence, the relationship between thicknesses and widths of respective parts, a ratio of sizes of the respective parts and the like are not always equal to those of an actual semiconductor device. Furthermore, even when the identical parts are described in the drawings, sizes or ratios of sizes of the parts may differ depending on drawings.

In this disclosure and respective drawings, elements illustrated in the other drawings and described previously are given the same symbols, and detailed explanation of the identical parts may be omitted when appropriate.

First Embodiment

Figure 1B:
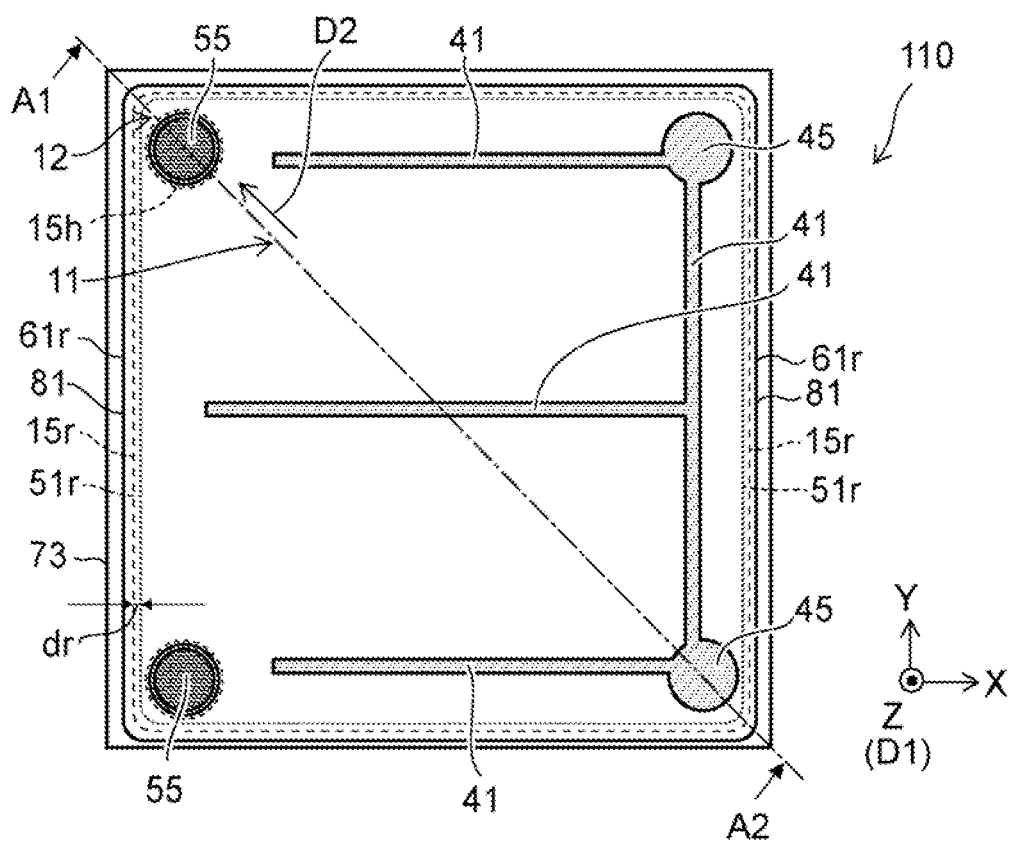

FIG. 1A and FIG. 1B are schematic views depicting a semiconductor light emitting element according to a first embodiment.

FIG. 1B is a plan view. FIG. 1A is a cross-sectional view taken along a line A1-A2 in FIG. 1B. FIG. 1B is a plan view as viewed in the direction indicated by an arrow Ar in FIG. 1A. In FIG. 1B some elements are depicted in a see-through manner using a broken line.

As depicted in FIG. 1A and FIG. 1B, a semiconductor light emitting element 110 includes: a laminated body 15; first electrodes 41; second electrodes 55; and a first conductive layer 51.

The laminated body 15 includes a first semiconductor layer 10, a second semiconductor layer 20, and a third semiconductor layer 30. The first semiconductor layer 10 is a first conductive type. The second semiconductor layer 20 is a second conductive type. For example, the first conductive type is an n type, and the second conductive type is a p type. Alternatively, the first conductive type may be the p-type, and the second conductive type may be the n-type. In the explanation of specific examples made hereinafter, the first conductive type is assumed to be the n-type, and the second conductive type is assumed to be the p-type.

The third semiconductor layer 30 is disposed between at least a part of the first semiconductor layer 10 and at least a part of the second semiconductor layer 20. The third semiconductor layer 30 is an active layer. The third semiconductor layer 30 is a light emitting portion, for example.

The direction toward the first semiconductor layer 10 from the second semiconductor layer 20 is assumed as the first direction D1. The second semiconductor layer 20 and the first semiconductor layer 10 are laminated to each other. The first direction D1 is assumed as the Z axis direction. One direction perpendicular to the Z axis direction is assumed as the X axis direction. The direction perpendicular to the Z axis direction and the X axis direction is assumed as the Y axis direction.

Nitride semiconductor material is used to form the first semiconductor layer 10, the second semiconductor layer 20, and the third semiconductor layer 30, for example.

The laminated body 15 spreads along an X-Y plane. The laminated body 15 includes a first region 11 and a second region 12. The second region 12 is spaced from the first region 11 in the second direction D2 along the cross-section line A1-A2, however the first region 11 and the second region 12 are also connected to each other as seen in FIG. 1B. The first region 11 and the second region 12 are continuously formed with each other excepting where the laminated body 10 is penetrated by element 55 (second electrode 55). For example, a hole 15h is disposed between the first region 11 and the second region 12. A non-continuous portion is formed between the first region 11 and the second region 12 of the laminated body 15. The non-continuous portion corresponds to the hole 15h.

The first electrodes 41 are electrically connected to the first semiconductor layer 10.

In this disclosure, an electrically connected state includes, a state where a first conductor and a second conductor are directly connected to each other, and a state where a third conductor is interposed between the first conductor and the second conductor so that an electric current may flow between the first conductor and the second conductor through the third conductor.

The second electrode 55 is disposed between the first region 11 and the second region 12 of the laminated body 15. The second electrode 55 is disposed in the hole 15h formed in the laminated body 15. The second electrode 55 penetrates the laminated body 15 in the first direction D1. In some embodiments, the second electrode 55 may not be required to penetrate the full thickness of laminated body 15 in the first direction D1. Thus, a thickness of the second electrode 55 in the Z axis direction (first direction D1) may be larger than, equal to, or smaller than a thickness of the laminated body 15 in the Z axis direction. The laminated body 15 surrounds the second electrode 55 in an X-Y plane using the first direction D1 as an axis of rotation about second electrode 55. Thus, for example, hole 15h may appear generally circular when viewed from direction Ar, though this is not specifically required.

The first conductive layer 51 connects the second semiconductor layer 20 and the second electrode 55 to each other. The first conductive layer 51 spreads along a plane (an X-Y plane, for example) which intersects with the first direction D1.

The first conductive layer 51 includes a first conductive portion 51a and a second conductive portion 51b. The second conductive portion 51b is lined up with the first conductive portion 51a in the second direction D2. The first conductive layer 51 further includes a portion 51c disposed between the first conductive portion 51a and the second conductive portion 51b.

The first conductive portion 51a is lined up with the first region 11 in the Z axis direction. The second conductive portion 51b is lined up with the second region 12 of the laminated body 15 in the Z axis direction. The portion 51c disposed between the first conductive portion 51a and the second conductive portion 51b is lined up with the second electrode 55 in the Z axis direction.

The second electrode 55 is electrically connected to the portion 51c disposed between the first conductive portion 51a and the second conductive portion 51b. Due to such an electrical connection, the second electrode 55 is electrically connected to the second semiconductor layer 20 through the first conductive layer 51. The second electrode 55 functions as a pad electrode, for example.

In this first embodiment, the laminated body 15 is disposed between the first electrode 41 and the first conductive layer 51. The first semiconductor layer 10 is disposed between the first electrode 41 and the first conductive layer 51. The third semiconductor layer 30 is disposed between the first semiconductor layer 10 and the first conductive layer 51. The second semiconductor layer 20 is disposed between the third semiconductor layer 30 and the first conductive layer 51.

The semiconductor light emitting element 110 further includes another pad electrode 45. The pad electrode 45 is electrically connected to the first electrode 41.

A voltage is applied between the second electrode 55 and the pad electrode 45 (first electrode 41). An electric current is supplied to the laminated body 15 through the first conductive layer 51. Due to the supply of the electric current, light is emitted from the third semiconductor layer 30. The semiconductor light emitting element 110 is an LED (light emitting diode), for example.

The semiconductor light emitting element 110 further includes a first insulation layer 61. At least a portion of the first conductive layer 51 (at least a part of the first conductive portion 51a and a part of the second conductive portion 51b) is disposed between the second semiconductor layer 20 and the first insulation layer 61.

The first conductive portion 51a is disposed between the first region 11 and the first insulation layer 61. The second conductive portion 51b is disposed between the second region 12 and the first insulation layer 61. The portion 51c disposed between the first conductive portion 51a and the second conductive portion 51b is disposed between the second electrode 55 and the first insulation layer 61.

In this first embodiment, an outer edge 51r of the first conductive layer 51 is positioned inside an outer edge 15r of the laminated body 15. For example, the outer edge 51r of the first conductive layer 51 which is obtained by projecting the outer edge 51r of the first conductive layer 51 on a plane (an X-Y plane, for example) which intersects with the first direction D1 is positioned inside the outer edge 15r of the laminated body 15 which is obtained by projecting the outer edge 15r of the laminated body 15 on the plane. For example, the outer edge 51r is positioned inside the outer edge 15r as viewed in the Z axis direction. For example, the outer edge 15r is positioned around the outer edge 51r when the outer edge 15r and the outer edge 51r are projected on the X-Y plane.

That is, the outer edge 51r of the first conductive layer 51 is covered by the laminated body 15. Due to such a configuration, it is possible to suppress peeling off or the like of the first conductive layer 51. Peeling off occurs at the outer edge 51r in many cases without the inclusion of this device design aspect (i.e., overlaying the laminated body 15 in the Z direction above outer edge 51r).

The outer edge 51r is covered by the laminated body 15 so that substantially the entire surface of the first conductive layer 51 is covered by the laminated body 15 and the second electrode 55. The deterioration of the first conductive layer 51 by migration or chemical reaction or the like may thus be suppressed.

According to the first embodiment, the operational reliability of the semiconductor light emitting element may be enhanced. It is thus possible to provide the semiconductor light emitting element with high reliability.

In this first embodiment, the outer edge 51r of the first conductive layer 51 is positioned inside an outer edge 61r of the first insulation layer 61. The outer edge 51r is sandwiched between the first insulation layer 61 and the laminated body 15. An outer edge portion of the first conductive layer 51 is covered by the first insulation layer 61 and the laminated body 15 and hence, the semiconductor light emitting element may acquire higher reliability.

In the first embodiment, a distance dr between the outer edge 51r of the first conductive layer 51 and the outer edge 15r of the laminated body 15 (a distance in the direction perpendicular to the first direction D1) is in a range of 0.1 micrometers (μm) to 10 μm. In taking into account alignment accuracy of an alignment machine, accuracy of 0.1 μm or less at minimum may be expected by using a projection-type aligner such as a stepper. When a contact-type aligner is used, there may be a case where a margin of approximately 10 μm is provided. Along with the decrease of the distance dr, the light emitting area may be increased so that a light output may be enhanced. Along with the increase of the distance dr, the reproducibility becomes more favorable and hence, a yield rate may be enhanced. Accordingly, even when irregularities exist in manufacturing processes, the outer edge 51r of the first conductive layer 51 may be surely disposed inside the outer edge 15r of the laminated body 15. Further, the semiconductor light emitting element may ensure a large light emitting area.

The distance dr between the outer edge 51r of the first conductive layer 51 and the outer edge 15r of the laminated body 15 is, for example, 0.2 or more times and 5 or less times as large as the thickness of the laminated body 15 in the first direction D1. A taper angle of a side surface of the laminated body 15 falls within a range of 30° or more and 80° or less, for example. The taper angle is an angle which is made between the side surface of the laminated body 15 and the X-Y plane. A range of the taper angle may be set by wet processing as well as by dry processing. There may be a case where a positional relationship between the outer edge 51r and the outer edge 15r is observed using an optical microscope in the midst of the manufacturing processes. The observation may be easily performed when the distance dr is 0.2 or more times as large as the thickness of the laminated body 15 in the first direction D1 in a state where the taper angle is set to 80°. The observation may be easily performed when the distance dr is 2 or more times as large as the thickness of the laminated body 15 in the first direction D1 in a state where the taper angle is set to 30°. Along with the increase of the distance dr, the accuracy at the time of observation is increased. A higher yield rate may be obtained by increasing the distance dr, for example. When the distance dr is extremely long, a light emitting area becomes narrow. Accordingly, the distance dr is preferably set to 5 or less times as large as the thickness of the laminated body 15 in the first direction D1. Due to such taper angle setting, the semiconductor light emitting element may acquire a large light emitting area together with high reliability.

The semiconductor light emitting element 110 further includes a metal layer 52. The metal layer 52 is disposed between the second semiconductor layer 20 and the first conductive layer 51. The metal layer 52 contains at least one metal selected from a group consisting of silver, rhodium, and a silver alloy. A silver layer, a rhodium layer or a silver alloy layer is used as the metal layer 52. A high light reflectance may be acquired by use such materials as the metal layer 52.

Additionally, low contact resistance may be acquired between the metal layer 52 and the second semiconductor layer 20.

For example, a reflectance of the metal layer 52 for light emitted from the third semiconductor layer 30 is higher than a reflectance of the first conductive layer 51 for the emitted light.

On the other hand, at least one metal selected from a group consisting of silver, rhodium, aluminum, copper and gold is used for forming the first conductive layer 51. By forming the first conductive layer 51 using such a material, the first conductive layer 51 may acquire low electrical resistance and a high stability.

As described later, the metal layer 52 may be omitted in some embodiments.

At least one metal selected from a group consisting of aluminum, titanium, platinum and gold (Au) is used for forming the first electrode 41, for example.

At least one metal selected from a group consisting of aluminum, titanium, platinum and gold (Au) is used for forming the pad electrode 45, for example.

The semiconductor light emitting element 110 further includes a second insulation layer 81. The second insulation layer 81 is disposed between the first region 11 of the laminated body 15 and the second electrode 55. The semiconductor light emitting element 110 further includes the second insulation layer 81 between the second region 12 of the laminated body 15 and the second electrode 55. For example, the second insulation layer 81 is disposed on a side surface of the hole 15h formed in the laminated body 15. The second electrode 55 is disposed in a region surrounded by the second insulation layer 81 in the inside of the hole 15h. The second electrode 55 and the laminated body 15 are insulated from each other by the second insulation layer 81. Accordingly, the reliability of the semiconductor light emitting element 110 is enhanced.

The second insulation layer 81 covers a side surface 15s of the laminated body 15. The side surface 15s intersects with the X-Y plane. For example, the side surface 15s has a tapered shape. An angle made between the side surface 15s and the X-Y plane is 30° or more and 80° or less. Due to such taper angle setting, the coverage of the second insulation layer 81 is enhanced. Reliability of the semiconductor light emitting element 110 is further enhanced.

A portion of the second insulation layer 81 is in contact with the first insulation layer 61. Due to such a contact, the side surface 15s of the laminated body 15 and the outer edge 51r of the first conductive layer 51 may be covered by the first insulation layer 61 and the second insulation layer 81. Accordingly, the semiconductor light emitting element 110 may acquire higher reliability.

The first insulation layer 61 and the second insulation layer 81 can be, independently, at least one of an oxide, a nitride, and an oxynitride. The oxide used for the insulation layer(s) may, for example, contain at least one material selected from a group consisting of silicon, aluminum, zirconium, hafnium, and titanium. The nitride used for the insulation layer(s) may, for example contain at least one material selected from a group consisting of silicon, aluminum, zirconium, hafnium, and titanium. The oxynitride used for the insulation layer(s) may, for example, contain at least one material selected from a group consisting of silicon, aluminum, zirconium, hafnium, and titanium. In a specific example, silicon oxide is used for forming the first insulation layer 61 and the second insulation layer 81. Accordingly, the first insulation layer 61 and the second insulation layer 81 absorb small amount of light. The semiconductor light emitting element may acquire high reliability. When silicon nitride is used for forming the first insulation layer 61 and the second insulation layer 81, the semiconductor light emitting element may acquire high heat conductivity and low heat resistance.

In this first embodiment, irregularities are formed on a front surface (upper surface in FIG. 1A) of the laminated body 15. The irregularities may be formed of a plurality of projecting portions 10p. For example, the first semiconductor layer 10 includes a first plane 10a and a second plane 10b. The first plane 10a faces the third semiconductor layer 30 in an opposed manner. The second plane 10b is a surface disposed on a side opposite to the first plane 10a. The irregularities (the plurality of projecting portions 10p) are formed on the second plane 10b. The laminated body 15 includes a first plane 15a and a second plane 15b. The first plane 15a faces the metal layer 52 in an opposed manner. The second plane 15b is a surface disposed on a side opposite to the first plane 15a. The irregularities (the plurality of projecting portions 10p) are formed on the second plane 15b.

A width 10w of the projecting portions 10p in the direction perpendicular to the first direction D1 (or the second direction D2, for example) is 0.5 or more times and 30 or less times as large as a wavelength (peak wavelength) of light emitted from the third semiconductor layer 30. By setting a width 10w of the projecting portions 10p to such a width, the light advancing direction may be changed so that light extraction efficiency may be enhanced. An intensity of light emitted from the third semiconductor layer 30 substantially becomes a peak (maximum) at a peak wavelength.

The semiconductor light emitting element 110 may further include a low concentration dopant film. The first semiconductor layer 10 is disposed between the low concentration dopant film and the third semiconductor layer 30. The above-mentioned irregularities (the plurality of projecting portions 10p) may be disposed on a front surface of the low concentration dopant film.

The semiconductor light emitting element 110 further includes a base body 72 (a support substrate, for example). The first conductive layer 51 is disposed between the base body 72 and the laminated body 15. The first insulation layer 61 is disposed between the base body 72 and the first conductive layer 51. A silicon substrate or the like is used as the base body 72, for example. A metal plate may be used as the base body 72. By using a metal plate as a base body 72, the semiconductor light emitting element may acquire high heat conductivity. An insulation plate (a sapphire substrate, an alumina substrate or a ceramic plate or the like) may be used as the base body 72.

The semiconductor light emitting element 110 further includes a bonding layer 73. The bonding layer 73 is disposed between the base body 72 and the first insulation layer 61. The bonding layer 73 bonds the base body 72 and the first insulation layer 61 to each other. A solder is used for forming the bonding layer 73, for example. For example, insulator bonding between dielectric bodies may be used.

In this first embodiment, a rear surface layer 71 is disposed on the base body 72. The semiconductor light emitting element 110 is fixed to a mounting part via the rear surface layer 71, for example.

In the first embodiment, a plating layer may be used as the base body 72. In such a case, the bonding layer 73 may be omitted.

In this first embodiment, the first electrode 41 has a thin linear shape. The first electrode 41 includes a portion extending in the X axis direction and a portion extending in the Y axis direction, for example. Due to the provision of the first electrode 41 having the thin linear shape, an electric current may be spread in the X-Y plane. A light shielding region may be made small—that is, the portion of the active layer that is covered/blocked by the first electrode 41 when viewed from direction Ar is small. The semiconductor light emitting element may thus acquire high light emitting efficiency.

Figure 2A:
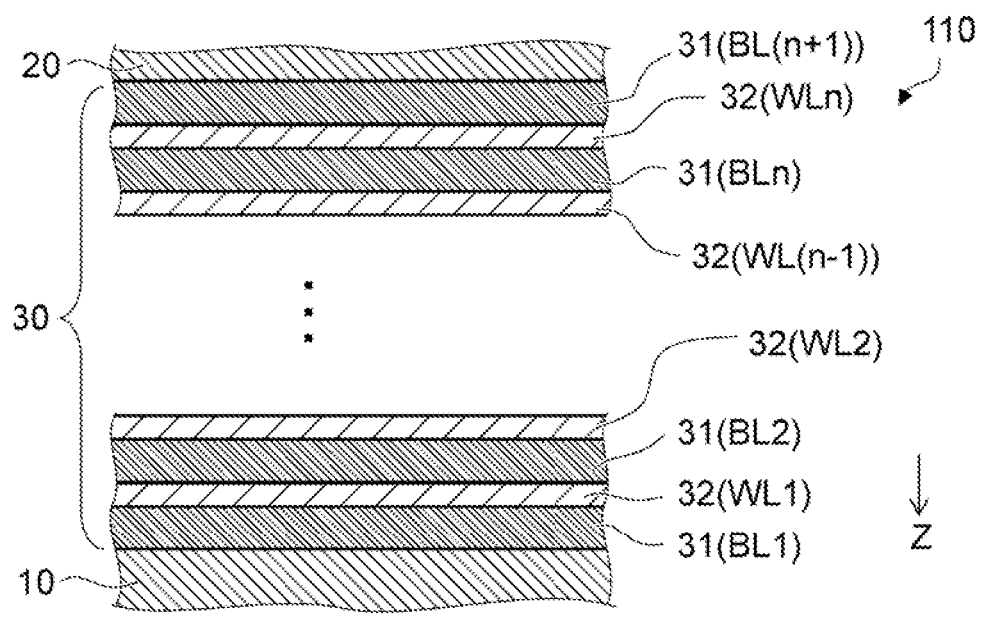
FIG. 2A and FIG. 2B are schematic cross-sectional views depicting a portion of the semiconductor light emitting element according to the first embodiment.
Figure 2B:
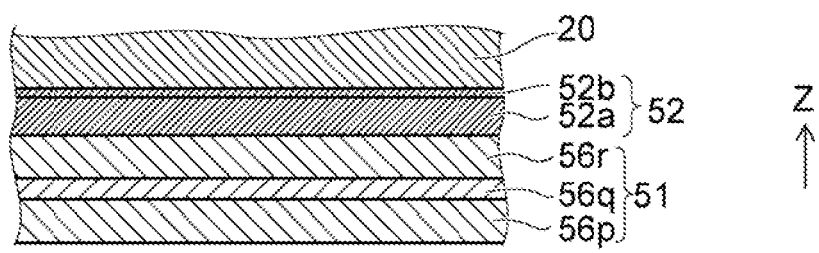

FIG. 2A and FIG. 2B are schematic cross-sectional views exemplifying a portion of the semiconductor light emitting element according to the first embodiment.

FIG. 2A illustrates a portion including the third semiconductor layer 30. FIG. 2B illustrates a portion including the first conductive layer 51.

As illustrated in FIG. 2A, the third semiconductor layer 30 includes a plurality of barrier layers 31 and well layers 32 each of which is disposed between each two of the plurality of barrier layers 31. For example, the plurality of barrier layers 31 and the plurality of well layers 32 are alternately disposed along the Z axis direction.

The well layer 32 contains $Al_{x1}Ga_{1-x1-x2}In_{x2}N$ ($0 \le x1 \le 1$, $0 \le x2 \le 1$, $x1+x2 \le 1$), for example. The barrier layer 31 contains $Al_{y1}Ga_{1-y1-y2}In_{y2}N$ ($0 \le y1 \le 1$, $0 \le y2 \le 1$, $y1+y2 \le 1$). A band gap energy of the barrier layer 31 is larger than a band gap energy of the well layer 32.

The third semiconductor layer 30 has a Single Quantum Well (SQW) configuration, for example. In the case where the third semiconductor layer 30 has the SQW configuration, the third semiconductor layer 30 includes two barrier layers 31 and a well layer 32 disposed between the barrier layers 31.

The third semiconductor layer 30 may have a Multi Quantum Well (MQW) configuration, for example. In the case where the third semiconductor layer 30 has the MQW configuration, the third semiconductor layer 30 includes three or more barrier layers 31 and well layers 32 each of which is disposed between each two barrier layers 31.

For example, the third semiconductor layer 30 includes (n+1) barrier layers 31 and n well layers 32 ("n" being an integer of 2 or more). An (i+1)-th barrier layer BL(i+1) is disposed between an i-th barrier layer BLi and the second semiconductor layer 20 ("i" being an integer of 1 or more and (n−1) or less). An (i+1)-th well layer WL (i+1) is disposed between an i-th well layer WLi and the second semiconductor layer 20. A first barrier layer BL1 is disposed between the first semiconductor layer 10 and a first well layer WL1. An n-th well layer WLn is disposed between an n-th barrier layer BLn and an (n+1)-th barrier layer BL(n+1). The (n+1)-th barrier layer BL(n+1) is disposed between an n-th well layer WLn and the second semiconductor layer 20.

A peak wavelength of light emitted from the third semiconductor layer 30 (emitted light) is 210 nanometers (nm) or more and 780 nm or less, for example. The peak wavelength may be set to a desired value.

A GaN layer containing an n-type dopant is used as the first semiconductor layer 10, for example. At least one element selected from a group consisting of Si, O, Ge, Te and Sn is used as an n-type dopant. The first semiconductor layer 10 may also include an n-side contact layer, for example.

A GaN layer containing a p-type dopant is used as the second semiconductor layer 20, for example. At least one element selected from a group consisting of Mg, Zn and C is used as the p-type dopant. The second semiconductor layer 20 may be a p-type contact layer, for example.

A thickness of the first semiconductor layer 10 is in a range of 100 nm or more and 10000 nm or less, for example.

A thickness of the second semiconductor layer 20 is in a range of 10 nm or more and 5000 nm or less, for example.

A thickness of the third semiconductor layer 30 is in a range of 0.3 nm or more and 1000 nm or less, for example.

A thickness of the barrier layer 31 is in a range of 0.1 nm or more and 50 nm or less, for example.

A thickness of the well layer 32 is in a range of 0.1 nm or more and 10 nm or less, for example.

In the embodiment illustrated in FIG. 2B, the first conductive layer 51 includes a first metal film 56p, a second metal film 56q and a third metal film 56r. The second metal film 56q is disposed between the first metal film 56p and the second semiconductor layer 20. The third metal film 56r is disposed between the second metal film 56q and the second semiconductor layer 20.

Metal having excellent adhesiveness with respect to the metal layer 52 may be used for forming the first metal film 56p, for example. Metal having low resistivity may be used for forming the second metal film 56q, for example. By forming the first metal film 56p and the second metal film 56q using such metal, an electric current may be spread. Metal having excellent adhesiveness with respect to the metal layer 52 may be used for forming the third metal film 56r, for example.

The first metal film 56p contains at least one metal selected from a group consisting of Ni, Ti and Al, for example.

The second metal film 56q contains at least one metal selected from a group consisting of Ti, Pt, Au, Al, Ag, Rh and Cu, for example.

The third metal film 56r contains at least one of Ni, Ti and Al, for example.

The first conductive layer 51 adopts the laminated structure and hence, the semiconductor light emitting element may easily acquire a low electrical resistance and high reliability.

The metal layer 52 may have the laminated structure. The metal layer 52 may include a metal film 52a and a metal film 52b disposed between the metal film 52a and the second semiconductor layer 20. For example, a concentration of Pt in the metal film 52b is higher than a concentration of Pt in the metal film 52a. The metal film 52b may be formed in a dotted manner in an island shape.

Hereinafter, an example of a method of manufacturing a semiconductor light emitting element 110 is explained.

FIG. 3A to FIG. 3F are cross-sectional views schematically exemplifying the method of manufacturing of the semiconductor light emitting element according to the first embodiment.

Figure 3A:
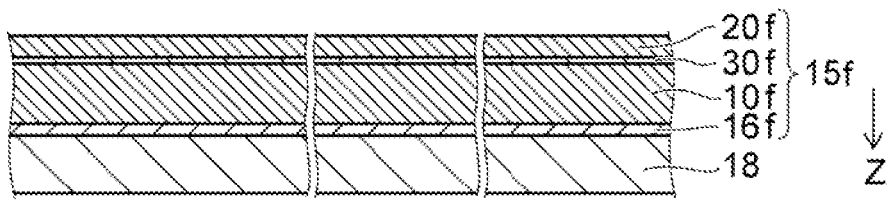
FIG. 3A to FIG. 3F are cross-sectional views schematically depicting a method of manufacturing the semiconductor light emitting element according to the first embodiment in the order of processes.

As illustrated in FIG. 3A, a low concentration dopant film 16f is formed on a substrate 18. The low concentration dopant film 16f may include a buffer film (a laminated film of nitride semiconductor films containing Al or the like, for example), for example. The low concentration dopant film 16f may also include a non-doped nitride semiconductor film (non-doped GaN layer or the like). A first semiconductor film 10f to be a first semiconductor layer 10 is formed on the low concentration dopant film 16f. An active film 30f to be a third semiconductor layer 30 is formed on the first semiconductor film 10f. A second semiconductor film 20f to be a second semiconductor layer 20 is formed on the active film 30f. By forming the films in such a manner, a laminated film 15f may be acquired.

In forming these films, epitaxial crystal growth is performed. For example, a Metal-Organic Chemical Vapor Deposition (MOCVD) method, a Metal-Organic Vapor Phase Epitaxy (MOVPE) method, a Molecular Beam Epitaxy (MBE) method, a Halide Vapor Phase Epitaxy (HYPE) method or the like is used.

A substrate made of any material selected from a group consisting of Si, SiO$_2$, AlO$_2$, quartz, sapphire, GaN, SiC and GaAs is used as the substrate 18, for example. A substrate which is made of the combination of elements selected from a group consisting of Si, SiO$_2$, AlO$_2$, quartz, sapphire, GaN, SiC and GaAs may be used also as the substrate 18. A surface orientation of the substrate 18 may be set as desired.

Figure 3B:
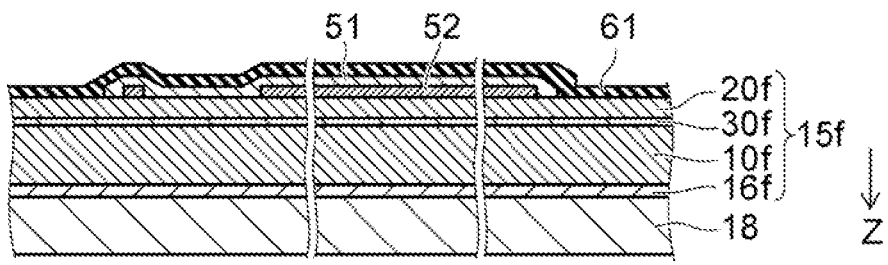

As illustrated in FIG. 3B, a metal layer 52 having a predetermined shape is formed on the second semiconductor film 20f. A first conductive layer 51 is formed on the metal layer 52 and the second semiconductor layer 20. A first insulation layer 61 is formed on the first conductive layer 51.

Figure 3C:
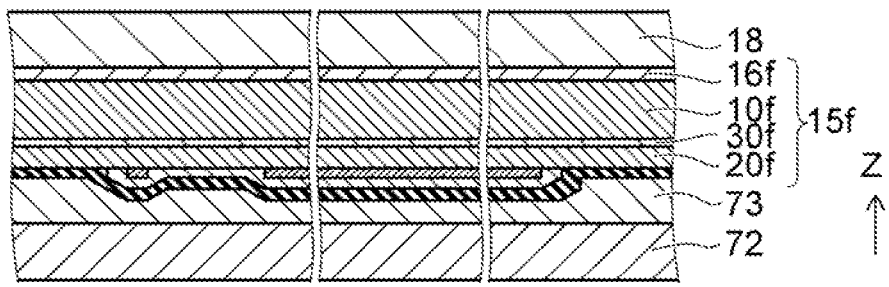

As illustrated in FIG. 3C, the first insulation layer 61 and a base body 72 are fixed to each other via a bonding layer 73.

Figure 3D:
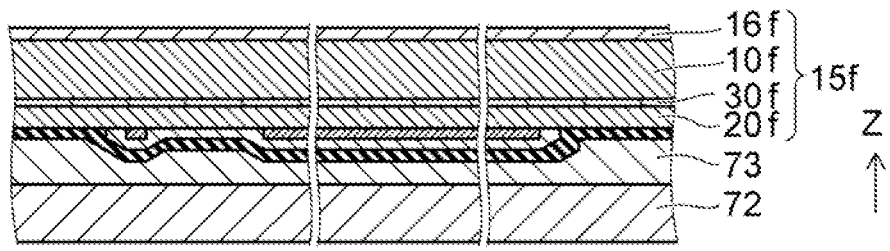

As illustrated in FIG. 3D, the substrate 18 is removed. In this embodiment, at least a part of the low concentration dopant film 16f remains. A front surface of the low concentration dopant film 16f is exposed. In the embodiment, the low concentration dopant film 16f may be removed. When the low concentration dopant film 16f is removed, a front surface of the first semiconductor film 10f (first semiconductor layer 10) is exposed. In the embodiment, for the sake of expositional convenience, the low concentration dopant film 16f may be considered as a part of the first semiconductor layer 10.

Figure 3E:
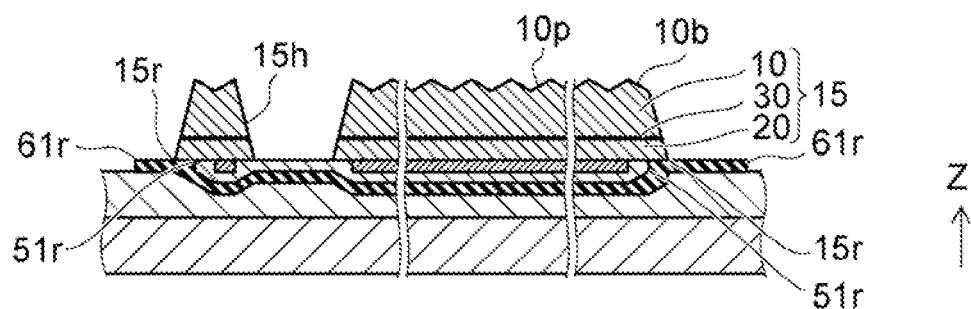

As illustrated in FIG. 3E, a portion of the laminated film 15f is removed. In removing the portion of the laminated film 15f, RIE (Reactive Ion Etching) or the like is used, for example. In removing the portion of the laminated film 15f, a hole 15h (a non-continuous portion in a laminated body 15) is formed. By forming the hole 15h, the laminated body 15 may be formed from the laminated film 15f.

At this point of time, an outer edge 15r of the laminated body 15 is positioned outside an outer edge 51r of the first conductive layer 51. For example, by forming a mask used at the time of processing the laminated film 15f into a proper shape, the above-mentioned positioning may be realized.

The outer edge 51r of the first conductive layer 51 is covered by the outer edge 15r of the laminated body 15 and hence, the outer edge 51r of the first conductive layer 51 is hardly damaged in the processing of the laminated film 15f. For example, when the outer edge 51r of the first conductive layer 51 is not covered by the laminated body 15, there may be a case where an outer edge portion of the first conductive layer 51 is damaged depending on a processing method or a processing condition of the laminated film 15f. For example, there may be a case where the outer edge portion of the first conductive layer 51 is peeled off. In this embodiment, the damage and the peeling off of the outer edge portion of the first conductive layer 51 may be suppressed and hence, the semiconductor light emitting element may have a high yield rate, for example.

Irregularities (a plurality of projecting portions 10p) are formed. For example, the irregularities are formed by applying wet processing which uses an acid.

Figure 3F:
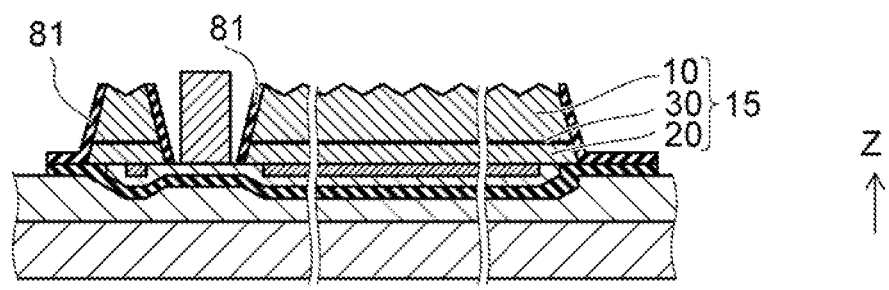

As illustrated in FIG. 3F, a second insulation layer 81 is formed.

Thereafter, first electrodes 41, a pad electrode 45, second electrodes 55, and a rear surface layer 71 are formed. A wafer is divided into a predetermined shape. Due to such processes, the semiconductor light emitting element 110 may be acquired.

In the above-mentioned manufacturing processes, the order of processing may be changed within a technically possible range. Annealing processing may be desirably applied to the wafer.

Figure 4:
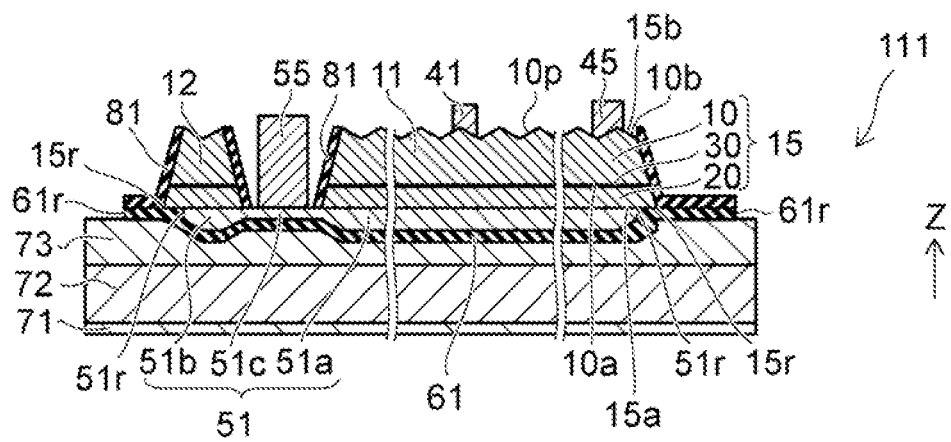
FIG. 4 is a schematic cross-sectional view depicting another semiconductor light emitting element according to the first embodiment.

FIG. 4 is a schematic cross-sectional view exemplifying another semiconductor light emitting element according to a second embodiment.

As illustrated in FIG. 4, a metal layer 52 is omitted in another semiconductor light emitting element 111 according to the second embodiment. In such a case, a rhodium film is used as a first conductive layer 51, for example. By using the rhodium film as the first conductive layer 51, the semiconductor light emitting element 111 may acquire a low contact resistance together with high light reflectance.

Figure 5:
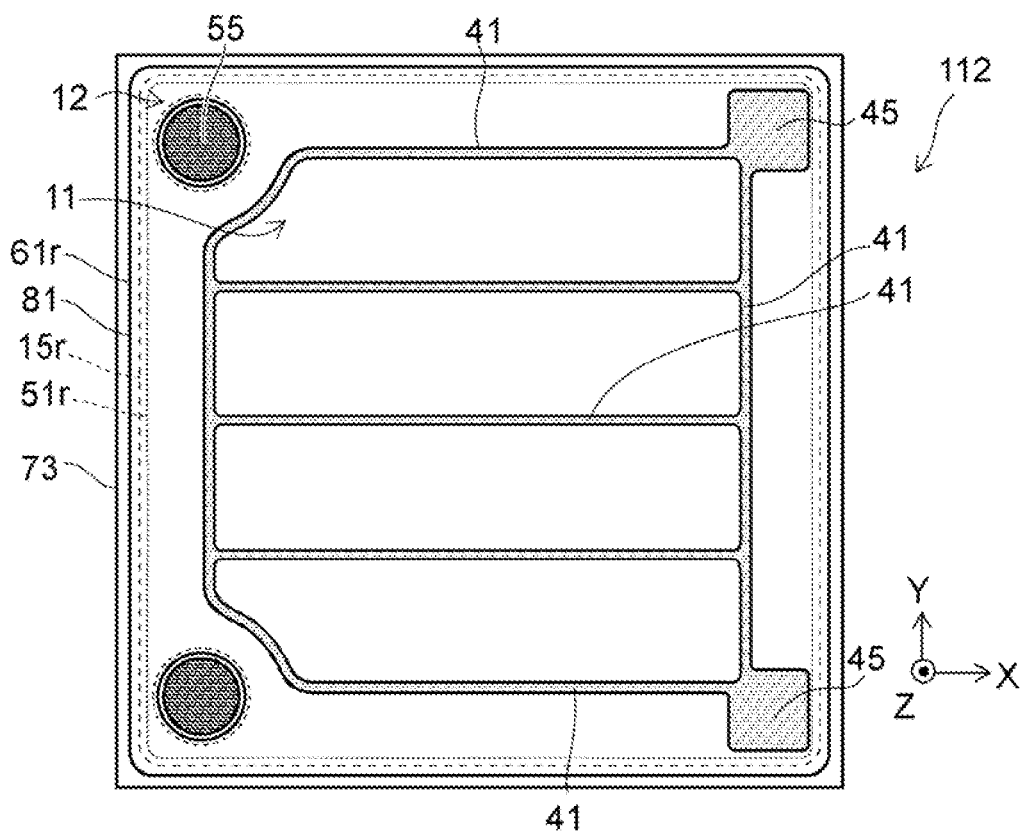
FIG. 5 is a schematic plan view depicting still another semiconductor light emitting element according to the first embodiment.

FIG. 5 is a schematic plan view exemplifying still another embodiment of a semiconductor light emitting element.

As illustrated in FIG. 5, semiconductor light emitting element 112, a shape of a first electrode 41 differs from a shape of the corresponding first electrode of the semiconductor light emitting element 110.

In the semiconductor light emitting element 112, the first electrode 41 includes a portion which extends along an outer edge of a chip (an outer edge of a base body 72 and an outer edge of a bonding layer 73, for example). Another portion of the first electrode 41 extends while traversing a center portion of the chip. Further, a portion of the first electrode 41 extends along a plane shape of a second electrode 55 in the vicinity of the second electrode 55. Uniformity of light emission intensity in plane is enhanced.

The semiconductor light emitting elements 110 to 112 include the electrodes (second electrodes 55). The laminated body 15 is disposed around the electrode (second electrode 55) within a first plane (X-Y plane). In the laminated body 15, the second semiconductor layer 20 is spaced apart from the first semiconductor layer 10 in the first direction D1 which intersects with the first plane (X-Y plane). The first conductive layer 51 spreads along the first plane (X-Y plane), and connects the second semiconductor layer 20 and the electrode (second electrode 55) to each other. The outer edge 51r of the first conductive layer 51 obtained by projecting the outer edge 51r of the first conductive layer 51 on the first plane is positioned inside the outer edge 15r of the laminated body 15 obtained by projecting the outer edge 15r of the laminated body 15 on the first plane.

Third Embodiment

Figure 6A:
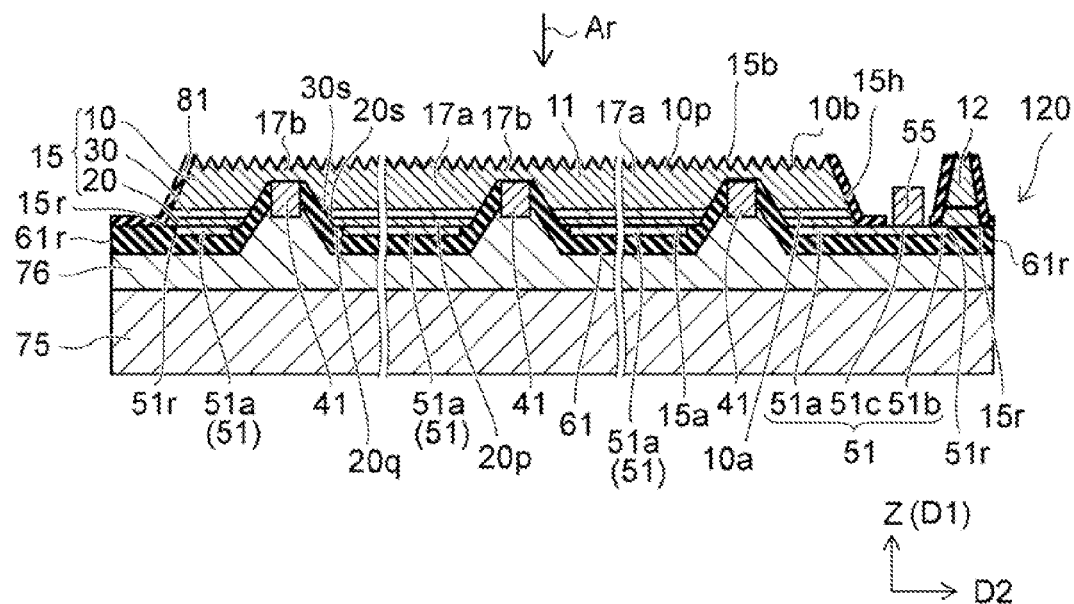
FIG. 6A and FIG. 6B are schematic views depicting a semiconductor light emitting element according to a second embodiment.
Figure 6B:
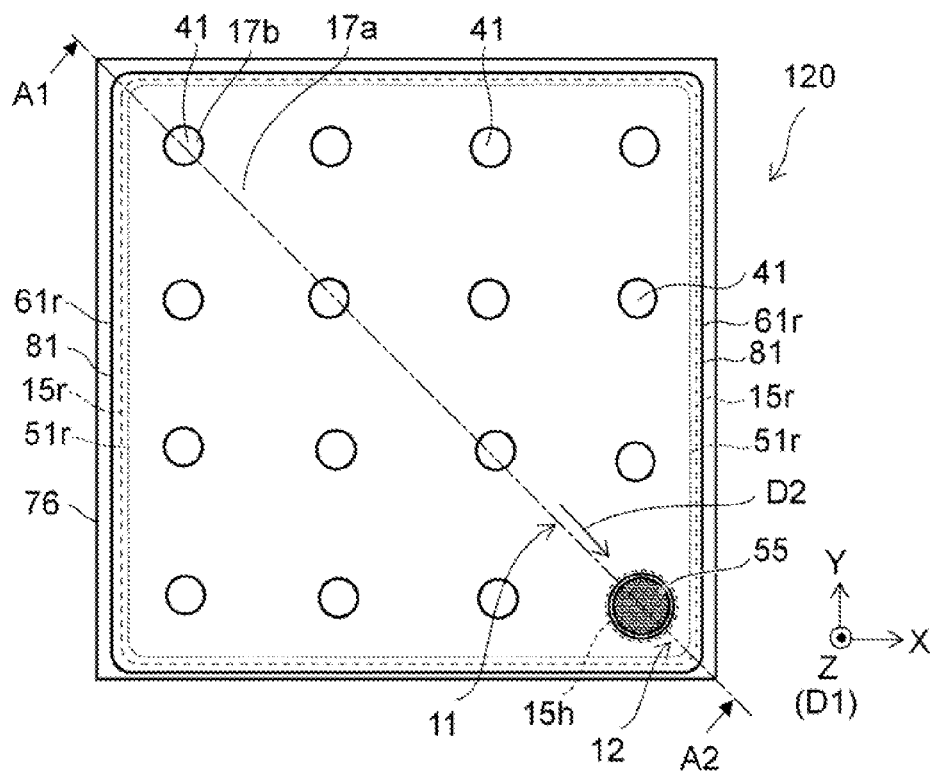

FIG. 6A and FIG. 6B are schematic views exemplifying a semiconductor light emitting element according to a third embodiment.

FIG. 6B is a plan view. FIG. 6A is a cross-sectional view taken along a line A1-A2 in FIG. 6B. FIG. 6B is a plan view as viewed in the direction indicated by an arrow Ar in FIG. 6A. In FIG. 6B some elements are depicted in a see-through manner using a broken line.

As illustrated in FIG. 6A and FIG. 6B, a semiconductor light emitting element 120 according to this third embodiment also includes: a laminated body 15; first electrodes 41; second electrodes 55; and a first conductive layer 51. Hereinafter, portions which make the semiconductor light emitting element 120 different from the semiconductor light emitting element according to the first embodiment are explained.

A first semiconductor layer 10 includes a first portion 17a and a second portion 17b. The first portion 17a configures a portion of the first semiconductor layer 10 (a portion where a third semiconductor layer 30 is disposed). The third semiconductor layer 30 is disposed between the first portion 17a and a second semiconductor layer 20.

The second portion 17b is lined up with the first portion 17a in the direction which intersects with the first direction D1 (or the second direction D2).

For example, a recessed portion is formed in the laminated body 15 (laminated film 15f). The recessed portion is formed by removing a portion of the second semiconductor layer 20 and a portion of the third semiconductor layer 30. A first electrode 41 is disposed in the recessed portion. The portion where the recessed portion is formed corresponds to the second portion 17b.

The first electrode 41 is connected to the second portion 17b. For example, the first electrode 41 overlaps with the second portion 17b when the first electrode 41 and the second portion 17b are projected on the X-Y plane.

The plurality of second portions 17b which are spaced apart from each other are disposed. The plurality of first electrodes 41 which are spaced apart from each other are disposed corresponding to the plurality of second portions 17b. Each of the plurality of first electrodes 41 is formed into an island shape. The plurality of second portions 17b are lined up with each other (disposed in a matrix array, for example) in the X-Y plane. The plurality of first electrodes 41 are lined up with each other (disposed in a matrix array, for example) in the X-Y plane corresponding to the plurality of second portions 17b.

For example, the semiconductor light emitting element 120 further includes a second conductive layer 76. The first conductive layer 51 is disposed between the second conductive layer 76 and the second semiconductor layer 20. The first insulation layer 61 is disposed between the second conductive layer 76 and the first conductive layer 51. The first electrode 41 is disposed between the second portion 17b and the second conductive layer 76.

In this embodiment, the semiconductor light emitting element 120 further includes a base body 75. The second conductive layer 76 is disposed between the base body 75 and the first insulation layer 61. A portion of the second conductive layer 76 is disposed between the base body 75 and the first electrode 41. The base body 75 is conductive, for example. The base body 75 is electrically connected to the first electrode 41 through the second conductive layer 76. The second conductive layer 76 is insulated from the first conductive layer 51 by the first insulation layer 61.

A voltage is applied between the base body 75 and the second electrode 55. An electric current is supplied to the laminated body 15 through the first conductive layer 51 and the second conductive layer 76. Due to the supply of the electric current, light is emitted from the third semiconductor layer 30.

Also in this third embodiment, an outer edge 51r of the first conductive layer 51 is positioned inside an outer edge 15r of the laminated body 15. For example, the outer edge 51r of the first conductive layer 51 which is obtained by projecting the outer edge 51r of the first conductive layer 51 on the X-Y plane is positioned inside the outer edge 15r of the laminated body 15 which is obtained by projecting the outer edge 15r of the laminated body 15 on the X-Y plane. In this third embodiment, the outer edge 51r of the first conductive layer 51 is positioned inside an outer edge 61r of the first insulation layer 61.

Also in the semiconductor light emitting element 120, the outer edge 51r of the first conductive layer 51 is covered by the laminated body 15 and hence, the semiconductor light emitting element 120 may acquire high reliability. The peeling off of the outer edge 51r of the first conductive layer 51 or the like may be suppressed and hence, the semiconductor light emitting element 120 may acquire a high yield rate.

The first insulation layer 61 covers a side surface of the laminated body 15. For example, the second semiconductor layer 20 includes a second semiconductor layer end portion 20s. The second semiconductor layer end portion 20s includes a side surface which intersects with the plane (X-Y plane) perpendicular to the first direction D1, for example. The third semiconductor layer 30 includes a third semiconductor layer end portion 30s. The third semiconductor layer end portion 30s includes a side surface which intersects with the X-Y plane, for example. The first insulation layer 61 covers the second semiconductor layer end portion 20s and the third semiconductor layer end portion 30s. Due to such a configuration, the first conductive layer 51 and the second semiconductor layer 20 may be electrically insulated from each other, and the first conductive layer 51 and the third semiconductor layer 30 may be electrically insulated from each other.

For example, a portion of the second semiconductor layer 20 (portion 20p) is in contact with the first conductive layer 51. Another portion of the second semiconductor layer 20 (portion 20q) is in contact with the first insulation layer 61. The portion 20q of the second semiconductor layer 20 and the first conductive layer 51 are insulated from each other by the first insulation layer 61.

In this third embodiment, a metal layer 52 is omitted. However, the semiconductor light emitting element 120 may further include the metal layer 52 in other embodiments.

In this disclosure, "nitride semiconductor" may be any semiconductor having the composition where a composition ratio between x, y and z is changed within respective ranges in a chemical formula of $B_xIn_yAl_zGa_{1-x-y-z}N$ ($0 \leq x \leq 1$, $0 \leq y \leq 1$, $0 \leq z \leq 1$, $x+y+z \leq 1$). As used herein, "nitride semiconductor" further includes semiconductors having the composition where a group V element other than N (nitrogen) is further added to the above-mentioned chemical formula, semiconductors having the composition where various elements added for controlling various physical properties such as a conductive type are further added to the above-mentioned chemical formula, and semiconductors having the composition where various elements which are contained unintentionally are added.

In the disclosure, "perpendicular" and "parallel" mean not only "perpendicular" and "parallel" in a strict meaning of the term. That is, "perpendicular" should be construed by taking into account irregularities which occur in manufacturing processes or the like, and "parallel" should be construed by taking into account irregularities which occur in manufacturing processes or the like. In other words, it is sufficient that "perpendicular" is "substantially perpendicular" and "parallel" is "substantially parallel".

The preferred embodiments have been described by reference to the specific examples heretofore. However, the present disclosure is not limited to these specific examples. For example, with respect to the specific configurations of the respective elements such as the first semiconductor layer, the second semiconductor layer, the third semiconductor layer, the laminated body, the first electrode, the second electrode, the first conductive layer, the metal layer, the first insulation layer, or the second insulation layer which the semiconductor light emitting element includes, these configurations fall within the scope of the present disclosure provided that those who are skilled in the art may carry out the present disclosure in the same manner as these embodiments by suitably selecting the configurations from a known range and may acquire the substantially equal advantageous effects as these embodiments.

Further, the combination of features in the specific examples within a technically possible range also falls within the scope of the present disclosure.

Further, all semiconductor light emitting elements which those who are skilled in the art may carry out by suitably changing designs based on the semiconductor light emitting elements described above as the example embodiments also fall within the scope of the present disclosure.

Still further, various variations and modifications are conceivable to those who are skilled in the art within a category of the technical concept of the present disclosure, and it is construed that these variations and modifications also fall within the scope of the present disclosure.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor light emitting element comprising:
   a laminated body including:
      a first semiconductor layer,
      a second semiconductor layer, and
      a third semiconductor layer disposed between the first semiconductor layer and the second semiconductor layer, the laminated body including an opening which penetrates the laminated body in a first direction from the first semiconductor layer to the second semiconductor layer;
   a first electrode electrically connected to the first semiconductor layer;
   a second electrode disposed in the opening; and
   a first conductive layer connecting the second semiconductor layer and the second electrode to each other, wherein
   a first outer edge of the first conductive layer is positioned inside a second outer edge of the laminated body, the first outer edge being an outermost edge of the first conductive layer in a second direction which crosses the first direction.

2. The semiconductor light emitting element according to claim 1, further comprising:
   a first insulation layer, wherein
   at least a part of the first conductive layer is disposed between the second semiconductor layer and the first insulation layer in the first direction, and
   the first insulation layer is directly adjacent to the first outer edge of the first conductive layer in the second direction.

3. The semiconductor light emitting element according to claim 2, further comprising:
   a base body, wherein
   the first conductive layer is disposed between the base body and the laminated body, and
   the first insulation layer is disposed between the base body and the first conductive layer.

4. The semiconductor light emitting element according to claim 3, further comprising:
   a bonding layer disposed between the base body and the first insulation layer, the bonding layer connecting the base body and the first insulation layer to each other.

5. The semiconductor light emitting element according to claim 2, wherein
   the laminated body is disposed between the first electrode and the first conductive layer in the first direction.

6. The semiconductor light emitting element according to claim 1, wherein
   the laminated body is disposed between the first electrode and the first conductive layer in the first direction.

7. The semiconductor light emitting element according to claim 1, wherein
   the laminated body has a first surface and a second surface opposite the first surface, the first semiconductor layer is directly adjacent the first surface and includes a first portion directly adjacent to the third semiconductor layer in the first direction and a second portion spaced from the third semiconductor layer in the first direction by the first portion, and the first electrode is connected to the second portion of the first semiconductor layer such that the second portion is between the first surface and the first electrode along the first direction.

8. The semiconductor light emitting element according to claim 7, further comprising:
a second conductive layer, wherein
the first conductive layer is disposed between the second conductive layer and the second semiconductor layer in the first direction,
the first insulation layer is disposed between the second conductive layer and the first conductive layer in the first direction, and
the first electrode is disposed between the second portion and the second conductive layer.

9. The semiconductor light emitting element according to claim 7, wherein the first insulation layer covers an edge portion of the second semiconductor layer and an edge portion of the third semiconductor layer.

10. The semiconductor light emitting element according to claim 7, wherein
a first part of the second semiconductor layer is directly adjacent the first conductive layer, and
a second part of the second semiconductor layer is directly adjacent the first insulation layer.

11. The semiconductor light emitting element according to claim 1, further comprising:
a second insulation layer between the laminated body and the second electrode.

12. The semiconductor light emitting element according to claim 1, further comprising:
a second insulation layer that covers a side surface of the laminated body, a part of the second insulation layer being in contact with the first insulation layer.

13. The semiconductor light emitting element according to claim 1, further comprising:
a metal layer disposed between the second semiconductor layer and the first conductive layer in the first direction, wherein
a reflectance of the metal layer for a light emitted from the third semiconductor layer is higher than a reflectance of the first conductive layer for the light emitted from the third semiconductor layer.

14. The semiconductor light emitting element according to claim 13, wherein
the metal layer includes at least one metal selected from a group consisting of silver, rhodium, and a silver alloy.

15. The semiconductor light emitting element according to claim 1, wherein
the first conductive layer includes at least one metal selected from a group consisting of silver, rhodium, aluminum, copper, and gold.

16. The semiconductor light emitting element according to claim 1, wherein
a distance along the second direction from the first outer edge of the first conductive layer to the second outer edge of the laminated body is in a range of 0.2 to 5 times a thickness of the laminated body in the first direction.

17. The semiconductor light emitting element according to claim 1, wherein
a distance along the second direction from the first outer edge of the first conductive layer to the second outer edge of the laminated body is 0.1 µm to 10 µm.

18. A semiconductor light emitting element, comprising:
a laminated body including
a first semiconductor layer,
a second semiconductor layer, and
a third semiconductor layer disposed between, along a first direction, at least a part of the first semiconductor layer and the second semiconductor layer;
a first electrode electrically connected to the first semiconductor layer;
a second electrode extending in the first direction into the laminated body; and
a first conductive layer extending along a first plane which crosses the first direction, and electrically connecting the second semiconductor layer and the second electrode, wherein
the first conductive layer extends within the first plane to a first outer edge of the first conductive layer, and the laminated body extends along a second plane that is parallel to the first plane to a second outer edge of the laminated body such that a straight line extending along the first direction from the first outer edge crosses the laminated body.

19. The semiconductor light emitting element according to claim 18, wherein
the laminated body has a first surface and a second surface opposite the first surface,
the first semiconductor layer is directly adjacent the first surface and includes a first portion directly adjacent to the third semiconductor layer in the first direction and a second portion spaced from the third semiconductor layer in the first direction by the first portion, and
the first electrode is connected to the second portion of the first semiconductor layer such that the second portion is between the first surface and the first electrode along the first direction.

20. A semiconductor light emitting element, comprising:
an electrode extending in a first direction that crosses a first plane;
a laminated body disposed in the first plane and surrounding the electrode in the first plane, the laminated body including:
a first semiconductor layer,
a second semiconductor layer spaced apart from the first semiconductor layer in the first direction, and
a third semiconductor layer between the second semiconductor layer and at least a portion of the first semiconductor layer in the first direction; and
a first conductive layer extending in a second plane parallel to the first plane and electrically connecting the second semiconductor layer to the electrode, wherein
the first conductive layer extends within the second plane to a first outer edge of the first conductive layer, and the laminated body extends within the second plane to a second outer edge of the laminated body such that a straight line extending along the first direction from the first outer edge crosses the laminated body.

* * * * *